United States Patent [19]

Balmer et al.

[11] Patent Number: 5,640,509
[45] Date of Patent: Jun. 17, 1997

[54] PROGRAMMABLE BUILT-IN SELF-TEST FUNCTION FOR AN INTEGRATED CIRCUIT

[75] Inventors: Mark J. Balmer, Tigard; Mark R. Waggoner, Hillsboro, both of Oreg.

[73] Assignee: Intel Corporation, Santa Clara, Calif.

[21] Appl. No.: 538,793

[22] Filed: Oct. 3, 1995

[51] Int. Cl.⁶ ................................................. G06F 11/00
[52] U.S. Cl. .................. 395/183.18 X; 395/183.06; 371/22.5; 371/22.6; 365/201
[58] Field of Search .................. 395/183.18, 183.05, 395/183.06; 371/21.1, 40.1, 40.4, 51.1, 61, 22.5, 22.6; 365/200, 201

[56] References Cited

U.S. PATENT DOCUMENTS

| | | | |
|---|---|---|---|
| 4,989,175 | 1/1991 | Boris et al. | 364/900 |
| 5,107,501 | 4/1992 | Zorian | 371/21.3 |
| 5,144,230 | 9/1992 | Katoozi et al. | 324/158 R |
| 5,157,781 | 10/1992 | Harwood et al. | 395/575 |
| 5,224,101 | 6/1993 | Popyock, Jr. | 371/21.1 |
| 5,355,369 | 10/1994 | Greenberger | 311/22.3 |
| 5,379,386 | 1/1995 | Swarts et al. | 395/325 |
| 5,386,392 | 1/1995 | Cantiant et al. | 365/233 |
| 5,535,164 | 7/1996 | Adams et al. | 365/201 |

*Primary Examiner*—Robert W. Beausoliel, Jr.
*Assistant Examiner*—Dieu-Minh Le
*Attorney, Agent, or Firm*—Blakely, Sokoloff, Taylor & Zafman

[57] ABSTRACT

A method and apparatus for providing programmable self-testing in a memory. Registers in the memory are programmed with a sequence of instructions for performing the self-test of the memory. The sequence of instructions is run to perform the self-test of the memory, and the results are checked. The memory includes a clock multiplier which allows the registers to be programmed at a first clock rate, then the memory is tested at a second clock rate which is faster than the first clock rate.

12 Claims, 11 Drawing Sheets

FIG_1

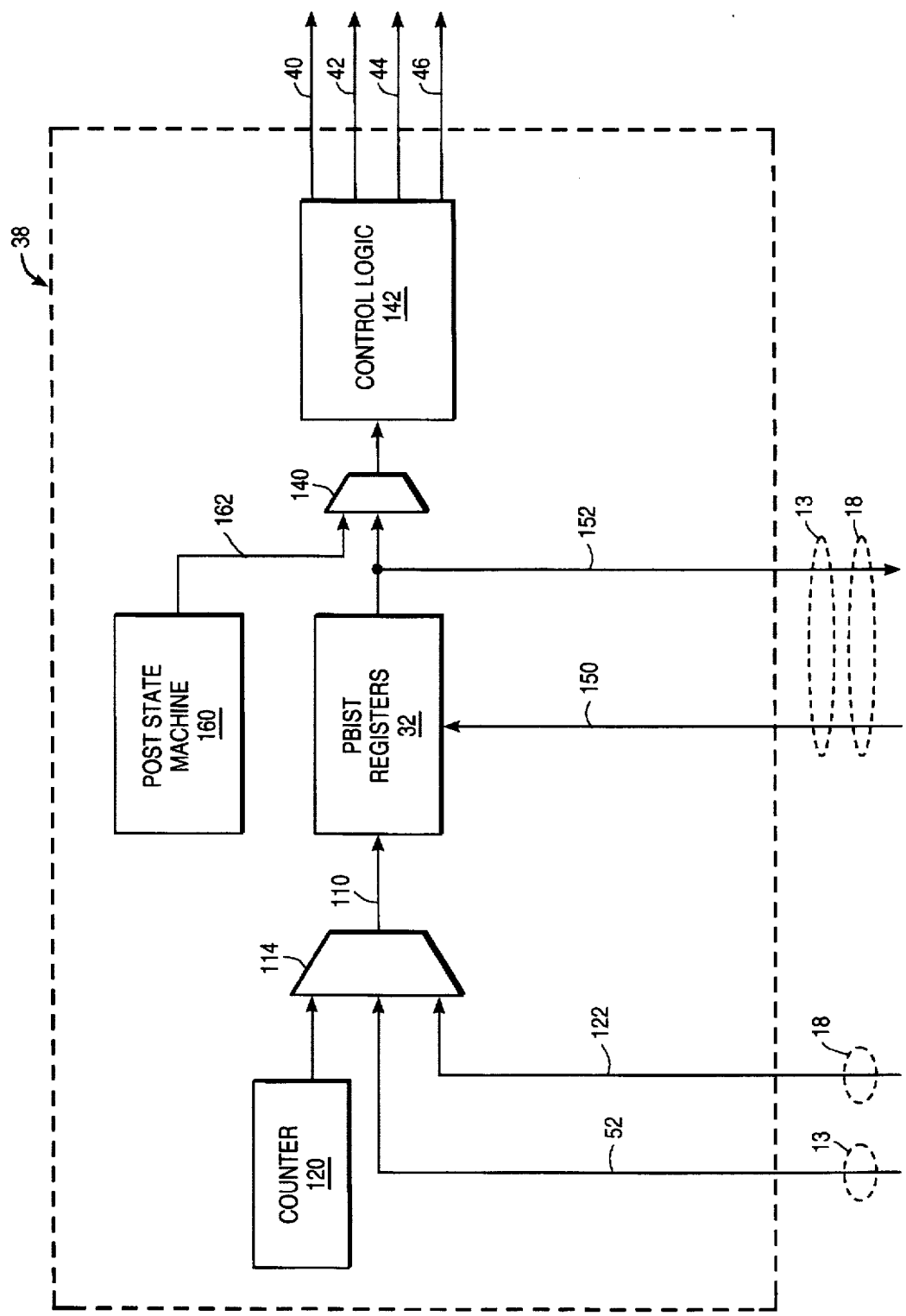
FIG_4

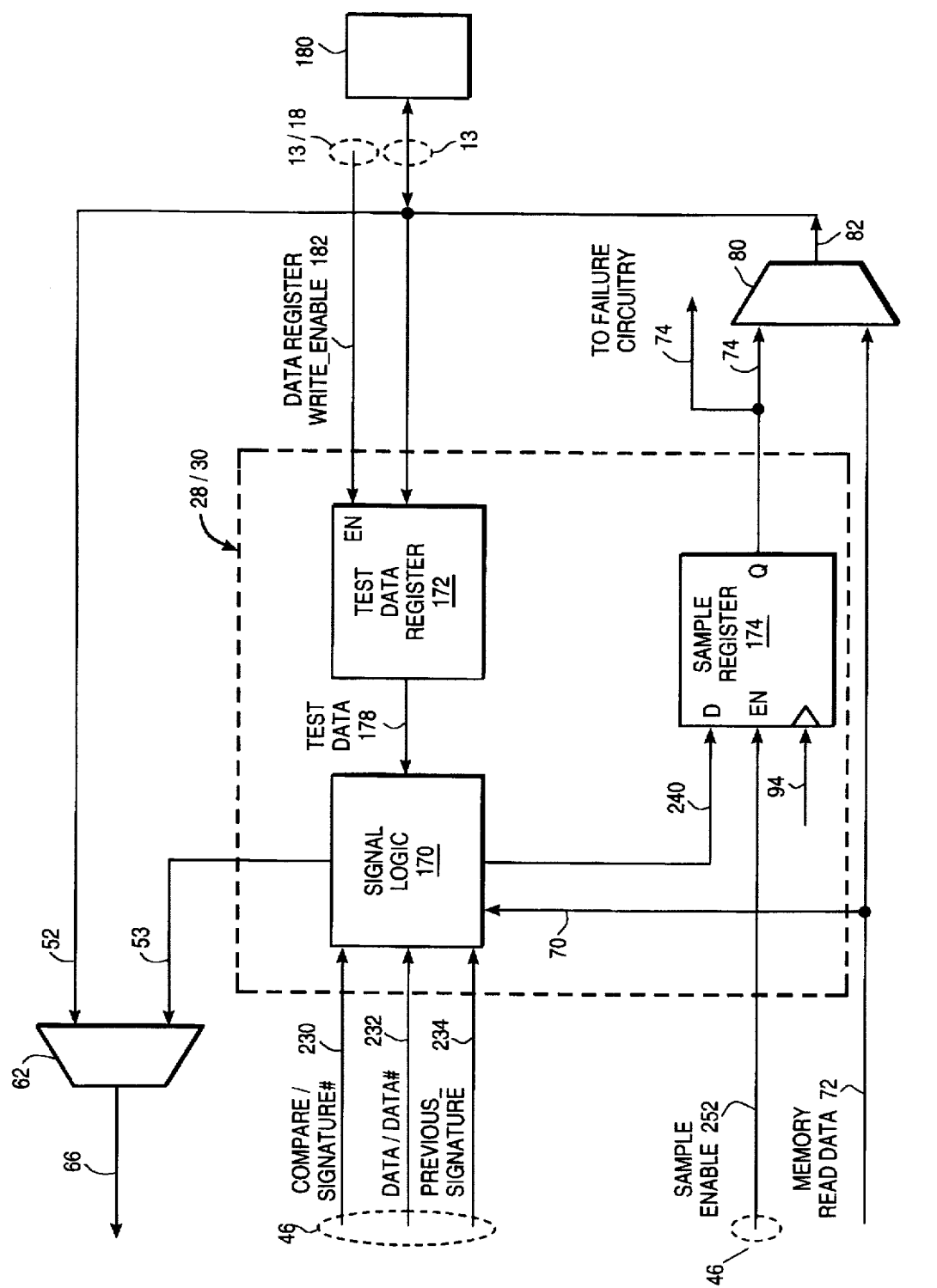
FIG_5

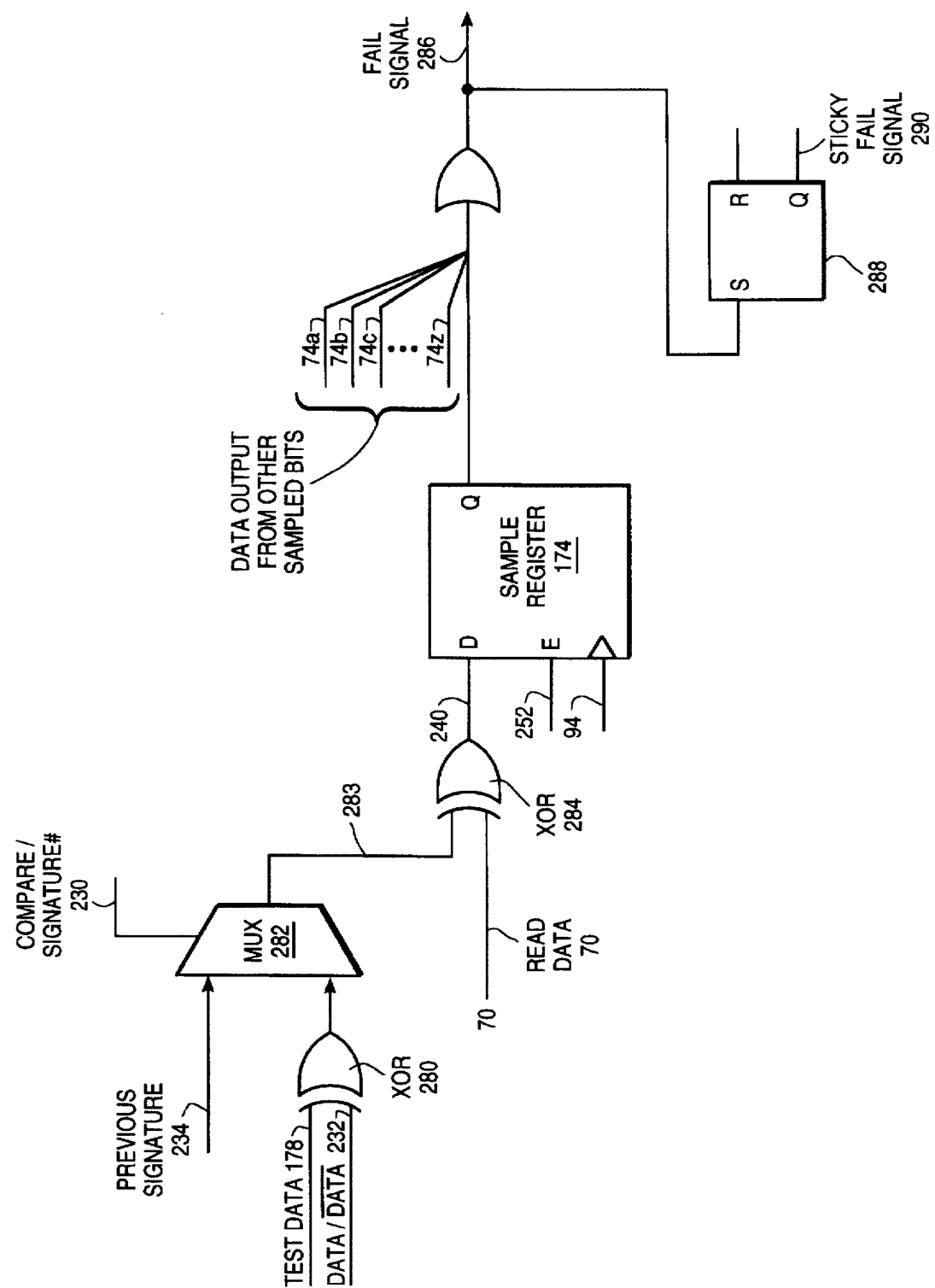
FIG_6

PBIST REGISTERS 32

TEST RESULTS REGISTER 300

| | SIG | CMP | CMP STICKY |
|---|---|---|---|
| | 2 | 1 | 0 |

WRITE CHUNK POINTER REGISTER 302

| WC VALUE | | WC3 | WC2 | WC1 | WC0 |
|---|---|---|---|---|---|
| 15  14 | 7 | 6  5 | 4  3 | 2  1 | 0 |

WAY AND READ CHUNK POINTER REGISTER 304

| WAY3 | WAY2 | WAY1 | WAY0 | RC3 | RC2 | RC1 | RC0 |
|---|---|---|---|---|---|---|---|
| 15 14 | 13 12 | 11 10 | 9 8 | 7 6 | 5 4 | 3 2 | 1 0 |

EMUX CONTROL REGISTER 306

| RESERVED | SET EMUX | WAY EMUX | RC EMUX |
|---|---|---|---|
| | 5  4  3 | 2  1 | 0 |

SET POINTER CONTROL REGISTER 308

| CRST | SRST | EN | SUB | SET OFFSET |
|---|---|---|---|---|
| 15 | 14 | 13 | 12 | 11 10 9 8 7 6 5 4 3 2 1 0 |

ADDRESS POINTER REGISTER 310

| RC VALUE | WAY VALUE | SET POINTER VALUE |
|---|---|---|
| 15 14 | 13 12 | 11 10 9 8 7 6 5 4 3 2 1 0 |

TEST MODE CONFIGURATION REGISTER 312

| RESERVED | COMP/ SIG | DATA/ TAG | PBIST EN | I/O |
|---|---|---|---|---|
| | 3 | 2 | 1 | 0 |

I/O REGISTER 314

| DATA PATTERN |
|---|
| 71                               0 |

DYNAMIC TEST OPERATION (0-15) 316

| | ADS | OPCODE (ADS = 1) | | | WC VAL | NXT WC | D/D̄ | SAMP. LE |
|---|---|---|---|---|---|---|---|---|
| | | SUB SET | NEXT SET | NEXT WAY | NEXT RC | | | | |
| | 8 | 7 | 6 | 5 | 4 | 3 | 2 | 1 | 0 |

FIG_7

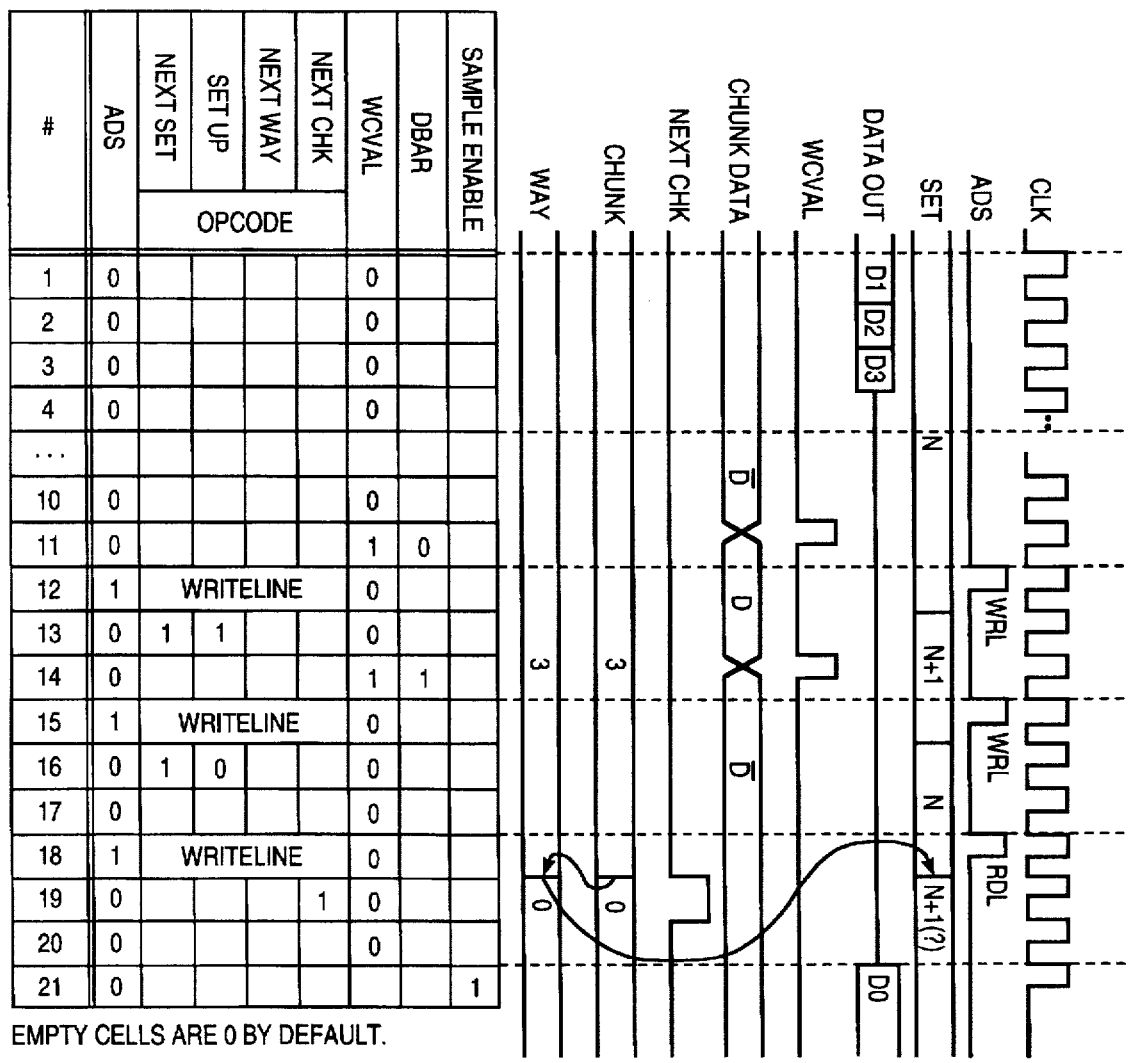
FIG_8

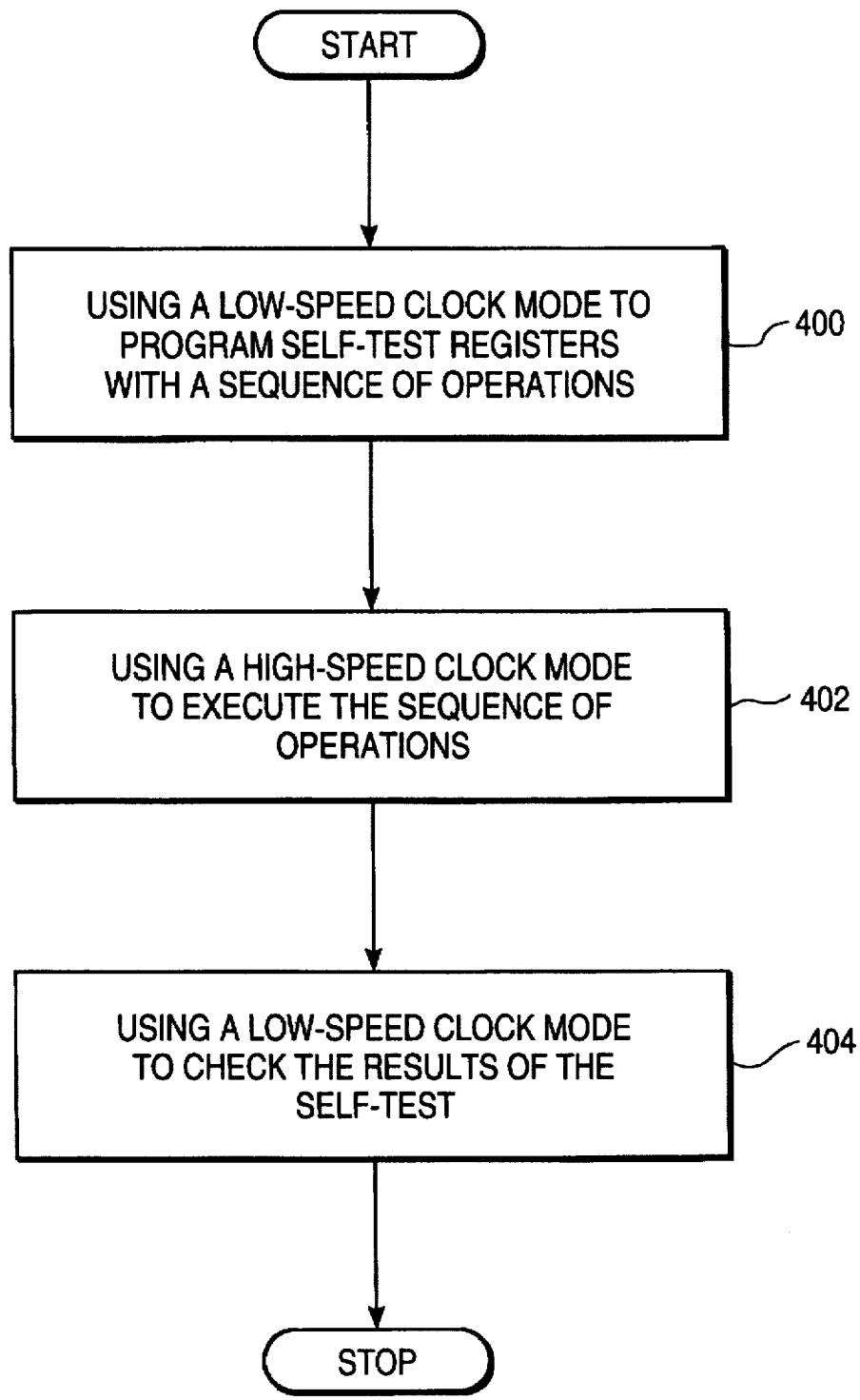
FIG_9

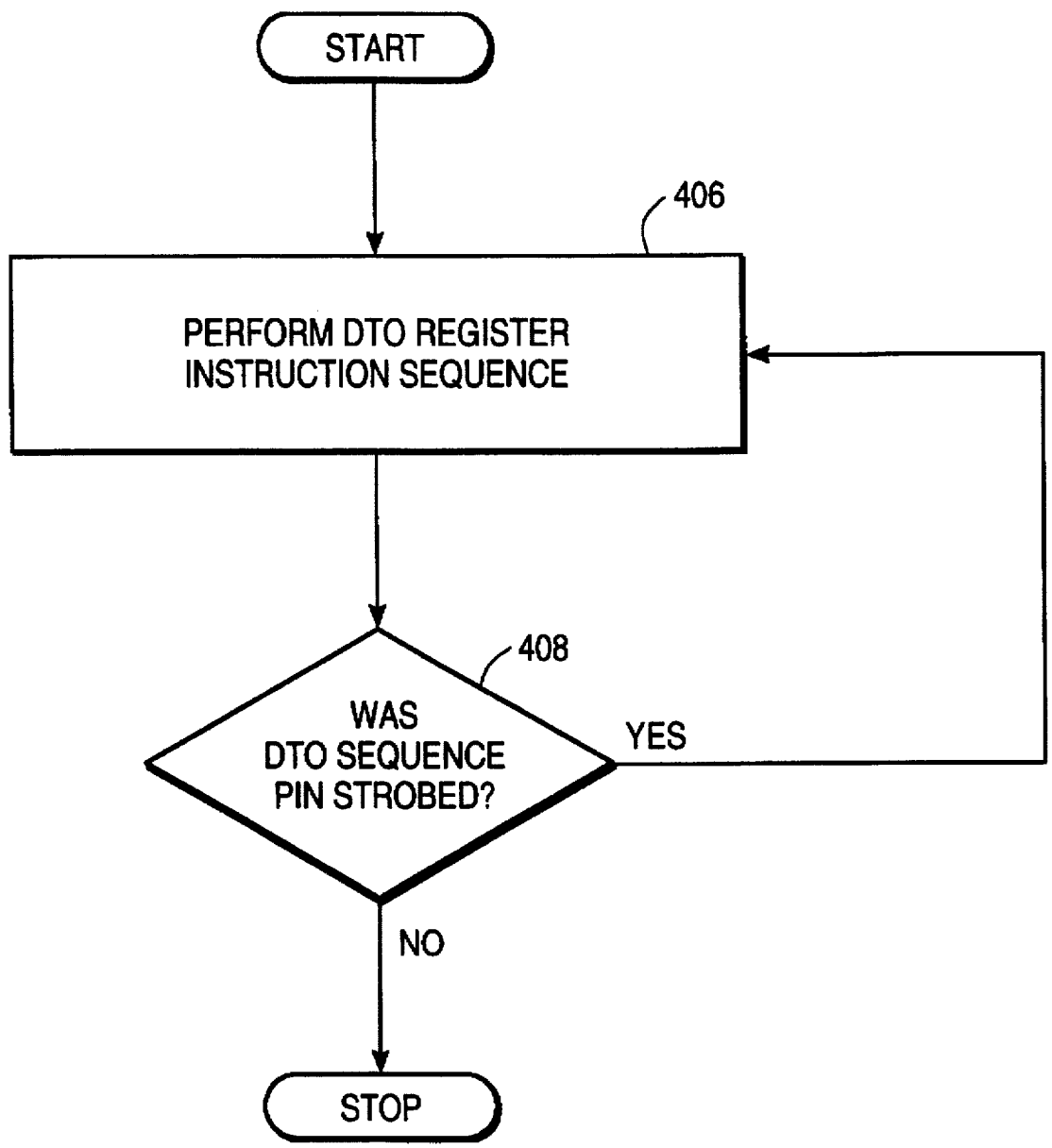
FIG_10

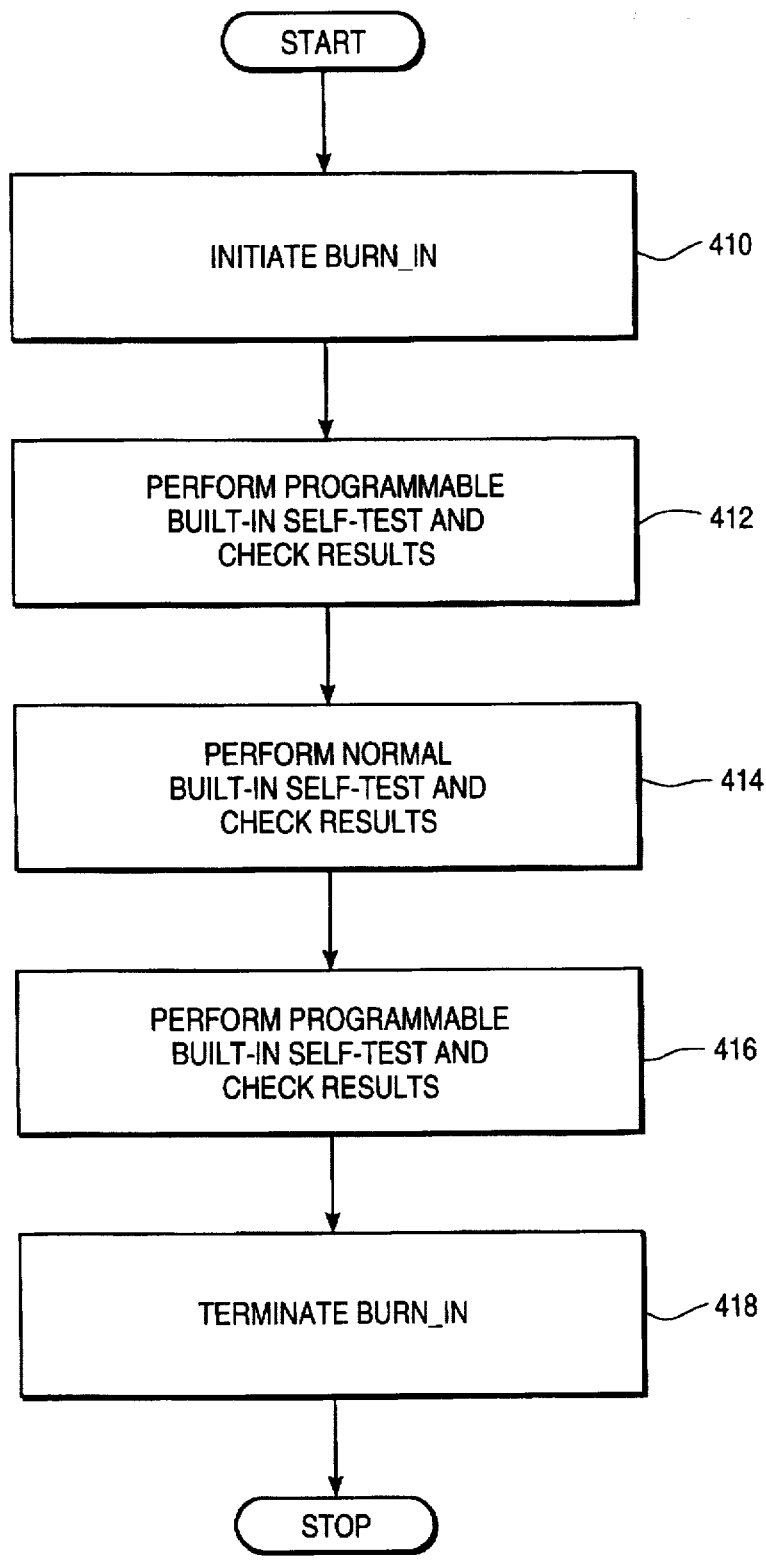
FIG_11

5,640,509

PROGRAMMABLE BUILT-IN SELF-TEST FUNCTION FOR AN INTEGRATED CIRCUIT

BACKGROUND OF THE INVENTION

1. Field of the Invention

The present invention pertains to the field of integrated circuit testing. More particularly, this invention relates to an integrated circuit having circuitry that provides a self-test function.

2. Background

Integrated circuit devices such as random access memories (RAMs) typically undergo device verification testing during manufacture. Typically, such verification tests are designed to detect both static and dynamic defects in such a memory array. Such static defects include, for example, open circuit and short circuit defects in the integrated circuit device. Dynamic defects include defects such as weak pull-up or pull-down transistors that create timing sensitive defects in such a memory array.

A specialized integrated circuit device tester is normally employed to perform manufacturing verification tests. For example, such a integrated circuit device tester may be used to perform read/write verification cycle tests on the memory array. Relatively low speed (e.g., 20 MHz), low cost integrated circuit device testers are usually sufficient for detecting static defects in the memory array. However, extremely expensive integrated device testers are needed to detect dynamic defects in very high speed memory arrays. Unfortunately, such expensive high speed integrated circuit testers increase the overall manufacturing costs for such devices. In addition, for integrated circuit devices that provide large memory arrays, the cycle time required to perform such read/write tests increases in proportion to the size of the array.

Attempts to overcome some of the difficulties associated with testing integrated circuit devices have included implementing built-in self-test (BIST) circuitry. For example, an integrated circuit cache memory array may contain circuitry to perform a 13N March pattern on the memory array. (See Appendix 1 for details about the 13N March pattern.) A state machine is typically used to generate the 13N March pattern along with circuitry to sample data output and to generate a signature of the results. The signature is then compared against an expected value to determine whether defects exist in the memory array. Such BIST circuitry usually enables high speed testing while obviating expensive high speed testers.

Unfortunately, past BIST routines have only been able to apply a preprogrammed test sequence on the memory array. As the process of manufacturing such a memory array evolves, manufacturing test engineers typically develop improved strategies for detecting both static and dynamic defects in the memory array. Unfortunately, such improved strategies for detecting defects can only be applied to testing that occurs while the device is placed in an expensive integrated circuit device tester. Up until now, engineers have been unable to achieve the benefits of improved test strategies without the use of an expensive tester, or by redesigning the integrated circuit device.

SUMMARY OF THE INVENTION

A method and apparatus for providing programmable built-in self-testing in a memory. Registers in the memory are programmed with a sequence of instructions for performing a self-test of the memory. The sequence of instructions is run to perform the self-test of the memory, and the results are checked. In one embodiment, the memory includes a clock multiplier which allows the registers to be programmed at a first clock rate, then the memory is tested at a second clock rate which is faster than the first clock rate.

Other features and advantages of the present invention will be apparent from the accompanying drawings, and from the detailed description that follows below.

BRIEF DESCRIPTION OF THE DRAWINGS

FIG. 4 illustrates a PBIST sequencer 38 for one embodiment.

FIG. 5 illustrates the portions of the data sample and compare circuit and the PBIST circuit used for providing data to the memory arrays and sampling data from the memory arrays.

FIG. 6 is one embodiment showing a more detailed view of FIG. 5.

FIG. 7 illustrates the various registers which make up PBIST register.

FIG. 8 shows one embodiment of DTO registers programmed to produce resultant wave forms.

FIG. 9 shows a flow diagram of one method of testing the memory using the PBIST circuitry.

FIG. 10 shows a flow diagram of the use of the DTO sequence pin.

FIG. 11 is a flow diagram showing that the programmable built-in self-test functions can be used during burn-in.

FIG. 12 illustrates a method of using the present invention without the use of the POST state machine.

DETAILED DESCRIPTION

Figure 1:
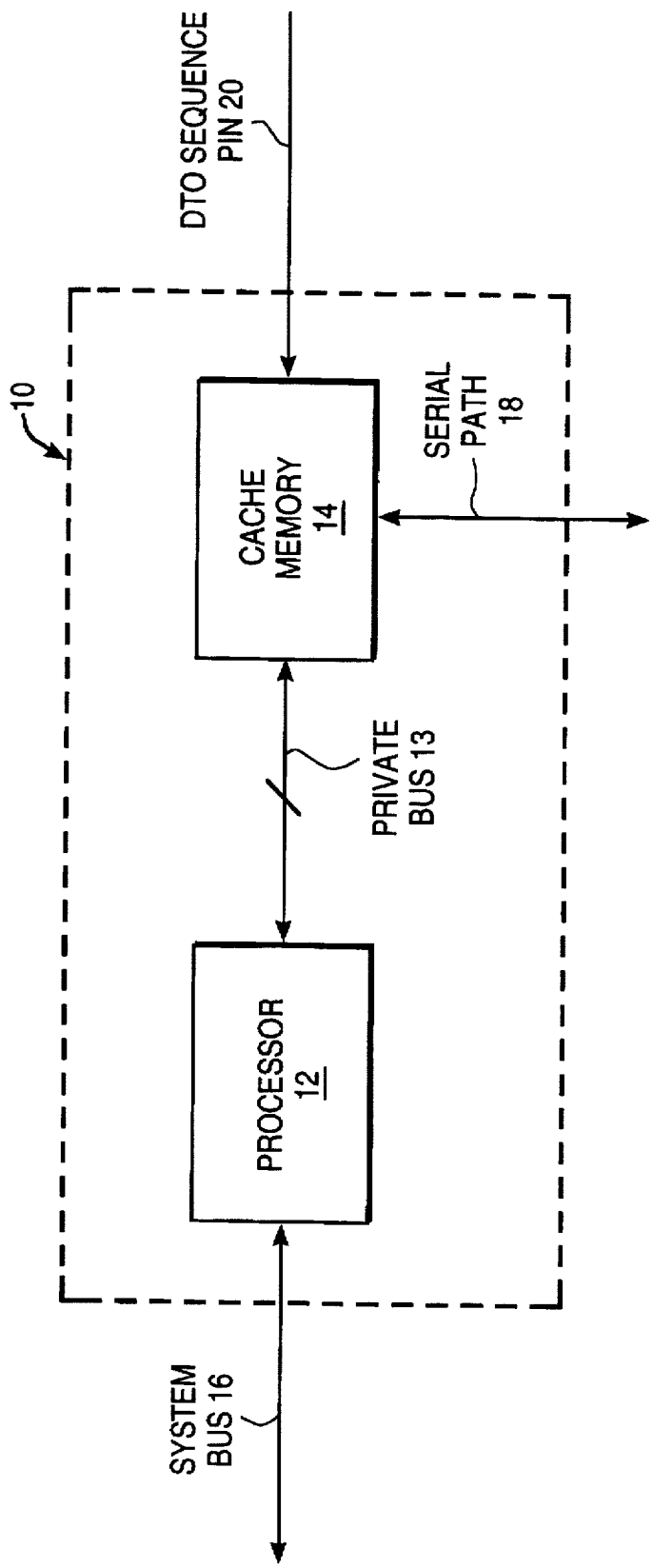
FIG. 1 illustrates a integrated circuit device package that contains a pair of integrated circuit dies.

FIG. 1 illustrates an integrated circuit device package 10 that contains a pair of integrated circuit dies. The integrated circuit dies include a processor 12 and a cache memory 14. The cache memory 14 functions as a closely coupled second-level (L2) cache for the processor 12. The processor 12 accesses the cache memory 14 via a high speed private bus 13. The processor 12 is also coupled via system bus 16 to other elements of a computer system such as main memory, mass storage devices, a display device, a keyboard, cursor control, hard copy devices, and so forth. In addition, the cache memory 14 is coupled to a serial path 18 that provides access to programmable built-in self-test functions of the cache memory 14. A DTO sequence pin 20 provides an input to the cache memory 14 from outside the integrated circuit device package as will be described with reference to FIG. 7.

Figure 2:
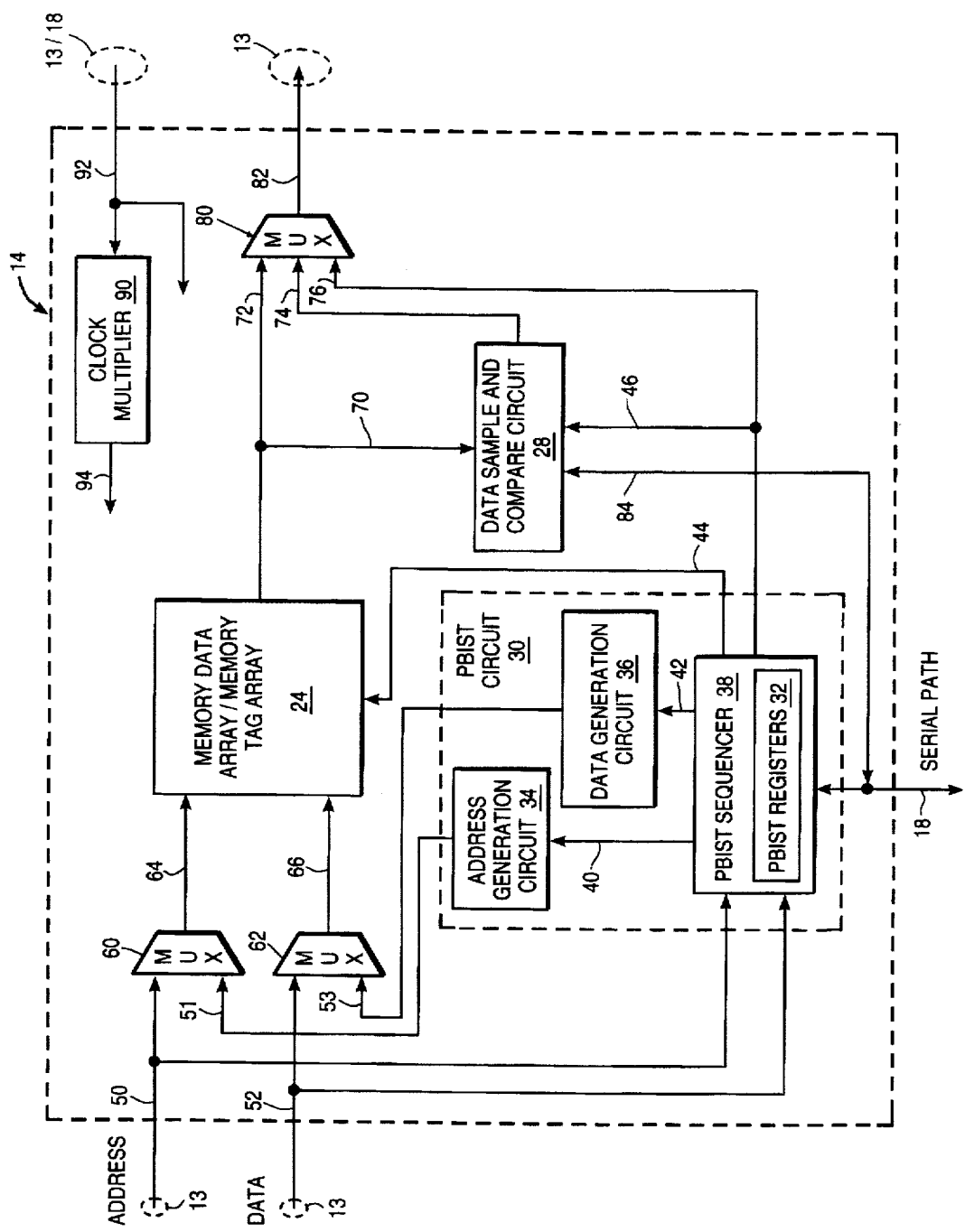
FIG. 2 is a block diagram of the cache memory.

FIG. 2 is a block diagram of the cache memory 14, which includes a memory data array and a cache memory tag array 24, data sample and compare circuit 28, and programmable built-in self-test (PBIST) circuit 30. The PBIST circuit 30 performs tests on the memory arrays 24. The PBIST circuit 30 contains a set of programmable (PBIST) registers 32 that determine a test sequence on the memory arrays 24. The PBIST registers 32 may be programmed by the processor 12 via the private bus 13. The PBIST registers 32 may also be programmed via the serial path 18. In one embodiment, serial path 18 is routed to the pins of the integrated circuit package. This allows the PBIST registers to be programmed by a low speed integrated circuit device tester coupled to the serial path 18 after the cache memory 14 has been packaged along with the processor 12. Additionally, a low speed integrated circuit device tester can be used to test the cache memory 14 prior to it being packaged with the processor 12 by coupling the tester either to the private bus 13 or the serial path 18.

The PBIST circuit 30 includes an address generation circuit 34, a data generation circuit 36, and a PBIST sequencer 38. The PBIST sequencer 38 includes the PBIST registers 32. The PBIST sequencer 38 is coupled to the address generation circuit 34 via control signals 40, and PBIST sequencer 38 is coupled to the data generation circuit 36 via control signals 42. PBIST sequencer 38 is also coupled to the memory arrays 24 via control signals 44, and PBIST sequencer 38 is coupled to the data sample and compare circuit 28 via control signals 46.

Private bus 13 provides an address input 50 and a data input 52 to the cache memory 14. Address input 50 provides an input to multiplexer 60 as well as an input to PBIST sequencer 38. The address generation circuit 34 provides a second address input 51 to the multiplexer 60. Multiplexer 60 selects between its address inputs 50 and 51 to provide an address input 64 to the memory arrays 24.

Data input 52 provides an input to multiplexer 62 as well as an input to PBIST sequencer 38. The data generation circuit 36 provides a second data input 53 to the multiplexer 62. Multiplexer 62 selects between its data inputs 52 and 53 to provide a data input 66 to the memory arrays 24.

The memory arrays 24 provide an output to the data sample and compare circuit 28 via data path 70 and to a multiplexer 80 via data path 72. The data sample and compare circuit 28 also provides an output which is coupled to multiplexer 80 via data path 74. Multiplexer 80 receives a third input from PBIST sequencer 38 via data path 76. Multiplexer 80 provides an output 82 which is provided onto the private bus 13.

The address generation circuit 34 generates self-test addressing for the memory arrays 24. The data generation circuit 36 generates self-test data for the memory arrays 24. The address generation circuit 34 and the data generation circuit 36 generate test addresses and test data according to the control signals 40 and 42, respectively, generated by the PBIST sequencer 38.

The PBIST sequencer 38 also provides read and write opcode signals to the memory arrays 24 via control signals 44 during built-in self-test. The combination of the read and write opcode signals via the signal path 44 and the self-test addresses and self-test data controlled via the control paths 40 and 42 provide read/write self-test functions on the memory arrays 24.

The data sample and compare circuit 28 samples the data output of the memory arrays 24 via a data path 70. The data sample and compare circuit 28 is controlled by the PBIST sequencer 38 via control signals 46. The PBIST sequencer 38 causes the data sample and compare circuit 28 to capture data from the memory arrays 24 during built-in self-test functions. The data sample and compare circuit provides the results of the self-test to multiplexer 80, which provides these results on the private bus 13. In one embodiment, every time the data is sampled by the data sample and compare circuit, the multiplexer 80 also provides the data to the private bus 13. The data sample and compare circuit 28 is also coupled to provide the results of the self-test to the serial path 18 via the signal path 84.

The cache memory 14 also includes a clock multiplier circuit 90. The clock multiplier 90 receives a low clock rate signal 92 selectable from either the private bus 13 or the serial path 18. The clock multiplier 90 provides a high clock rate signal 94 which is at a higher clock rate than the low clock rate signal 92. The clock multiplier can be implemented in a variety of different ways such as a phase lock loop (PLL), delay line loop (DLL), synchronous delay lines (SDL), or a multiplexed clock formed by XORing phase shifted clock inputs together.

In one embodiment, the cache memory 14 is synchronous such that there are clock inputs (not shown) to the address generation circuit 34, data generation circuit 36, PBIST sequencer 38 and data sample and compare circuit 28. The memory arrays 24 may be synchronous or asynchronous. The clock signal provided to the clock input of each of the synchronous elements is selectable between the high clock signal 94 or the low clock rate signal 92.

The clock multiplier 90 enables a relatively low speed inexpensive integrated circuit device tester coupled to the cache memory 14 generating a low frequency clock signal 92 to yield the high frequency clock signal 94 required for high speed testing of the memory arrays 24 during built-in self-test functions.

Figure 3:
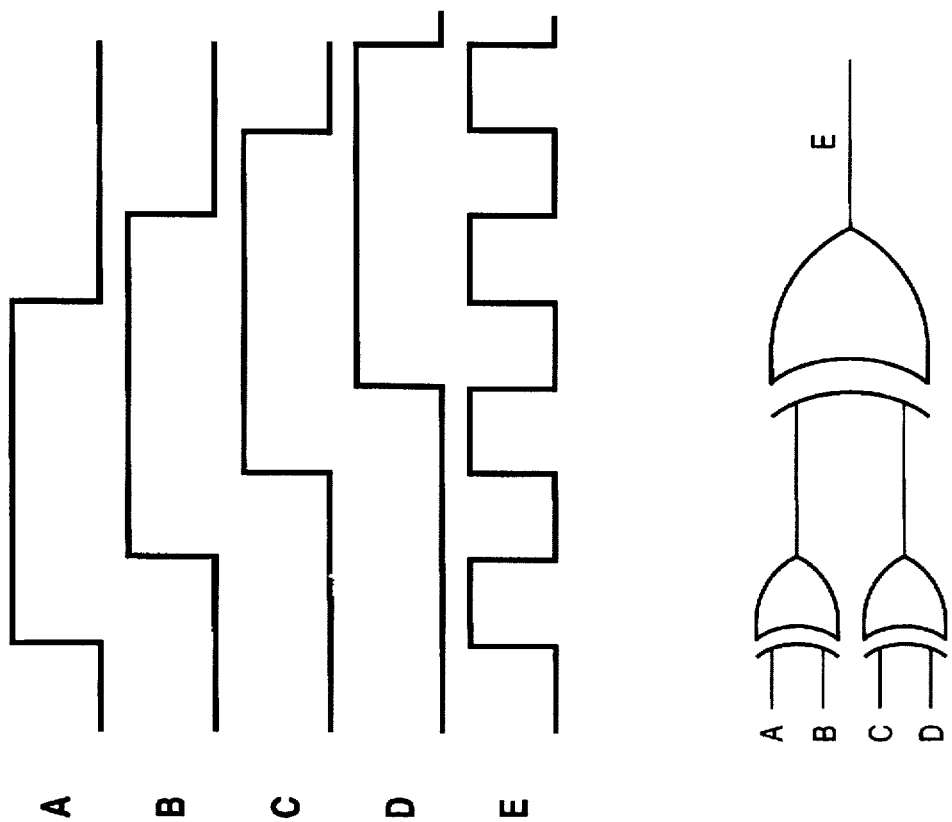
FIG. 3 shows one embodiment of a clock multiplier using multiple clock inputs to the memory.

FIG. 3 shows one embodiment of a clock multiplier 90 using multiple clock inputs to the memory 14. These clock inputs are XORed together to produce a higher clock rate signal. If a low clock rate signal is desired one or more of the multiple clock inputs can be tied to ground or Vcc. In another embodiment, a write to a control register selects between the high clock rate signal 94 and the low clock rate signal 92. In another embodiment, the clock multiplier 90 can be disabled such that the low clock rate signal 92 is passed through to the clock multiplier onto line 94 without the clock rate being increased.

FIG. 4 illustrates a PBIST sequencer 38 for one embodiment. The PBIST sequencer 38 includes a set of programmable PBIST registers 32 that control the test sequence for built-in self-test functions on the memory arrays 24. The PBIST registers 32 include global registers and Dynamic Test Operation (DTO) registers, as will be explained with reference to FIG. 7. The DTO registers are sequenced via an address path 110 driven by a counter circuit 120 via a multiplexer 114. The sources for the multiplexer 114 include the output of the counter circuit 120 as well as an address 52 provided by the private data bus 13 or an address 122 provided by the serial path 18. The selected address from either the counter circuit 120 or specified via the address paths 52 or 122 selects the contents of individual test registers of the PBIST registers 32 for transfer to a signal line 152. The signal line 152 is coupled to a multiplexer 140 and to the private bus 13 and the serial path 18.

The PBIST registers 32 via the multiplexer 140 provide data to control logic 142 which produces the control signals 40 that determine the functions of the address generation circuit 34, the control signals 42 that determine the sequence of data generated by the data generation circuit 36, the control signals 44 that provide read and write opcode signals to the memory arrays 24, and the control signals 46 that determine the data sampling functions of the data sample and compare circuit 28. The PBIST registers are written via a signal path 150 and read via the signal path 152. The signal paths 150 and 152 are accessible via the private bus 13 or via the serial path 18.

The PBIST sequencer 38 also includes a power on self-test (POST) state machine 160. The POST state machine 160 generates a predetermined sequence of data to control logic 142 via a signal path 162 and the multiplexer 140. The control logic 142 in response produces the control signals 40-46 that provide a predetermined test sequence for the memory arrays 24 such as the 13N March test sequence described in Appendix 1. The multiplexer 140 enables selection of either the power on self-test sequence from the POST state machine 160 or the program sequence from the PBIST registers 32 for testing the memory arrays 24.

FIG. 5 illustrates the portions of the data sample and compare circuit 28 and the PBIST circuit 30 used for providing data to the memory arrays 24 and sampling data from the memory arrays 24. The data sample and compare circuit 28 and the PBIST circuit 30 together contain the circuitry shown for each data bit sampled from the memory arrays 24 via the data path 70. In one embodiment, seventy-two bits (sixty-four data bits and eight error bits) are sampled per cycle, so the circuitry shown in FIG. 5 is replicated seventy-two times.

The circuitry in the data sample and compare circuit 28 and the PBIST circuit 30 include signal logic 170, a test data register 172, and a sample register 174.

The test data register 172 receives an input from a bond pad 180, which is coupled via one of the signal lines of the private bus 13 to one of the pins of the integrated circuit package. The test data register 172 also receives a data register write_enable signal 182 from either the private bus 13 or the serial path 18. The data register write_enable signal 182 enables the test data register 172 to receive a data input from the bond pad 180 or sample register 174. The test data register 172 is coupled to provide an input 178 to the signal logic 170.

Signal logic 170 receives several inputs from the control signals 46 including compare/signature# signal 230, data/data# signal 232, and previous_signature signal 234. Signal logic 170 provides an output 53 to a multiplexer 62 and an output 240 to the sample register 174. Multiplexer 62 also receives an input driven by the bond pad 180 via data path 52. The multiplexer 62 provides an output 66 which is coupled to the memory arrays 24.

Sample register 174 receives the input 240 from the signal logic 170. Sample register 174 also receives an enable signal 252 which is part of the control signals 46. The high speed clock signal 94 is coupled to provide a clock input to the sample register 174. Sample register 174 provides an output 74 which is coupled to the multiplexer 80. The output 74 is also provided to failure circuitry as shown in FIG. 6.

The memory arrays 24 provide memory read data 72 to the multiplexer 80. The memory arrays 24 also provide the memory read data 72 to the signal logic 170 via signal path 70.

The test data register 172 holds test data sampled from the bond pad 180 of the cache memory 14. The signal logic 170 generates a test data bit 53 for transfer to the memory arrays 24 through the multiplexer 62 via the input data path 66. The control signals 46 from the PBIST sequencer 38 determine the logical function of the test data bit 53. For example, a control signal data/data# 232 determines whether the signal logic 170 provides data bit 53 as the data bit stored in the test data register 172 or the complement of the data bit stored in the test data register 172. The compare/signature# control signal 230 determines whether sample register 174 performs a compare function or a signature function on data returning from the memory arrays 24 via the data path 70. The sample register is clocked by the high speed clock signal 94.

The sampled data bit 74 from the sample register 174 is provided back to the test data register 172. The sample enable signal 252 from the PBIST sequencer 38 enables the sampling function of the sample register 74.

FIG. 6 is one embodiment showing a more detailed view of FIG. 5. The test data 178 is provided as an input to an XOR gate 280. The data/data# signal 232 is also provided as an input to the XOR gate 280. The output of the XOR gate 280 is provided to a multiplexer 282. Thus, the XOR gate 280 provides either the test data value 178 or its complement to the multiplexer 282, depending on the value of the data/data# signal.

The multiplexer 282 receives a second input from the previous_signature signal 234. The previous—signature signal 234 operates like a multiple input linear feedback shift register in that it provides an input from the compare circuitry of a previous bit being compared. For example, if FIG. 6 shows the compare circuitry for bit 45, then the previous—signature signal comes from the compare circuitry for bit 44. Subsequently, a signature bit is provided to the compare circuitry of the subsequent bit. Continuing the example, a signature signal is provided to the compare circuitry for bit 46.

The compare/signature# signal 230 is provided to the multiplexer 282 to select between the two inputs to the multiplexer. If the compare/signature# signal indicates that the sample and compare logic is to perform a compare then the input from the XOR gate 280 will be output from the multiplexer 282. If the compare/signature# signal indicates that the sample and compare logic is to perform a signature function, then the previous—signature signal 234 is driven by the multiplexer 282.

The multiplexer 282 provides an input 283 to an XOR gate 284. The XOR gate 284 also receives a read data input from the memory arrays 24 via the data path 70. The XOR gate 284 provides the signal 240 to the sample register 174. The XOR gate 284 compares the data read from the memory arrays 24 with the signal 283. If they are the same, then XOR gate 284 will drive a '0' as an output. If the data read compared to the signal 283 are different, then the XOR gate 284 will drive a '1' as an output.

When the sample register 174 is enabled via the enable signal 252 and is clocked by the high clock rate signal 94, then the sample register 174 samples the data input 240 and provides the data as an output 74. The output 74 is ORed with the outputs 74a–74z of the other sampled bits (the other seventy-one bits in an embodiment that samples seventy-two bits per cycle) to produce a fail signal 286. The fail signal 286 can be coupled to a flip flop 288 to produce a sticky fail signal 290. If the compare/signature# signal 230 indicates that the signature function is to be performed, then the output 74 is also routed to the compare circuitry of the subsequent bit, as previously mentioned with regard to the previous_signature signal 234.

FIG. 7 illustrates the various registers which make up PBIST register 32. The PBIST registers 32 includes global registers including a test results register 300, a write chunk pointer register 302, a way and read chunk pointer register 304, an Emux control register 306, a set pointer control register 308, an address pointer register 310, a testmode configuration register 312, and an I/O register 314. The PBIST registers 32 also include sixteen Dynamic Test Operation (DTO) registers 316.

The test results register 300 indicates the result status of the self-test. In one embodiment, the test results register 300 includes three bits: a signature result, a comparator result, and a comparator-sticky result. The signature result is a compressed result of the test signature. It is '0' if the signature test failed and '1' if the test passed. The comparator result is a compressed result of the last sample compare. It is '0' if the last sample compare failed, and '1' if the last sample compare passed. The comparator-sticky result is the cumulative result of the comparator result. If the comparator result has ever failed, then the comparator-sticky result will indicate a fail. If the comparator result has never failed, then the comparator-sticky result will indicate a pass. In one embodiment, once the comparator-sticky result indicates a failure, it can only be returned to the pass state by a write to the test results register 300.

In one embodiment, the memory arrays 24 are a set associative memory which has a predetermined number of sets and ways. Each access to the memory arrays 24 is comprised of four "chunks" of data. For example, for each read of the memory arrays 24, four bus cycles retrieve the data requested from the memory 14. Each of the four bus cycles retrieves a contiguous "chunk" of data similar to a burst cycle. Similarly, in order to write to the memory arrays 24, four writes of a chunk of data are written to a buffer. Subsequently, the buffer transfers the data to the cache in cycles similar to a burst cycle.

Any location within the memory arrays 24 can be specified by a way, set, and chunk. The addressing circuitry has a way pointer, a set pointer, a read chunk pointer, and a write chunk pointer. These pointers can be redirected via the global register configurations. For example, the write chunk pointer register 302 allows the write chunk pointers to be reconfigured. Upon reset, write chunk pointer=0 always points to first write chunk, and the write chunk pointer=3 always points to the last write chunk. But these chunk pointers definitions can be reconfigured such that write chunk pointer=0 points to any of the four chunks. This programmability allows for better ways of testing the memory. Table 1 describes the programmable bits of the write chunk pointer register 302. Table 2 describes similar programmable bits for reconfiguring the way pointer and the read chunk pointer.

TABLE 1

WRITE CHUNK POINTER REGISTER 302

| Bit[15:14] | Write Chunk Pointer (Read only). Actual value of the write chunk pointer. |
|---|---|
| Bit[7:6] | Write Chunk Pointer bits, Group 3. These bits form the Write Chunk Pointer when the Write Chunk Counter equals 3. '11' after reset. |
| Bit[5:4] | Write Chunk Pointer bits, Group 2. These bits form the Write Chunk Pointer when the Write Chunk Counter equals 2. '10' after reset. |
| Bit[3:2] | Write Chunk Pointer bits, Group 1. These bits form the Write Chunk Pointer when the Write Chunk Counter equals 1. '01' after reset. |
| Bit[1:0] | Write Chunk Pointer bits, Group 0. These bits form the Write Chunk Pointer when the Write Chunk Counter equals 0. '00' after reset. |

TABLE 2

WAY AND READ CHUNK POINTER REGISTER 304

| Bit[15:14] | Way Pointer bits, Group 3. These bits form the Way Pointer when the Way Counter equals 3. '11' after reset. |
|---|---|
| Bit[13:12] | Way Pointer bits, Group 2. These bits form the Way Pointer when the Way Counter equals 2. '10' after reset. |
| Bit[11:10] | Way Pointer bits, Group 1. These bits form the Way Pointer when the Way Counter equals 1. '01' after reset. |
| Bit[9:8] | Way Pointer bits, Group 0. These bits form the Way Pointer when the Way Counter equals 0. '00' after reset. |
| Bit[7:6] | Read Chunk Pointer bits, Group 3. These bits form the Read Chunk Pointer when the Read Chunk Counter equals 3. '11' after reset. |
| Bit[5:4] | Read Chunk Pointer bits, Group 2. These bits form the Read Chunk Pointer when the Read Chunk Counter equals 2. '10' after reset. |
| Bit[3:2] | Read Chunk Pointer bits, Group 1. These bits form the Read Chunk Pointer when the Read Chunk Counter equals 1. '01' after reset. |
| Bit[1:0] | Read Chunk Pointer bits, Group 0. These bits form the Read Chunk Pointer when the Read Chunk Counter equals 0. '00' after reset. |

The Emux control register 306 includes two bits each for the Set, the Way and the Read Chunk. The Emux control register is configurable such that during the sequencing of the DTO registers as will be described, the Set, Way and Read Chunks can be incremented in different ways. A basic default for the Emux control register is to have the Set, Way, and Read Chunk pointers incremented or decremented manually, i.e., the DTO registers specify when to increment or decrement one of these pointers. However, by setting the bits in the Emux control register 306, the Set pointer can be programmed to be incremented whenever the Way pointer rolls over, i.e. has a carry. The Set pointer can also be programmed to be incremented whenever the Read Chunk pointer rolls over. Similarly, the Way pointer can be programmed to increment/decrement whenever either the Set pointer or Read Chunk pointers roll over. The Read Chunk pointer is also programmable dependent upon the carry of either the Set pointer or Way pointer. Various permutations are possible, with some pointers only be changed by the roll over of another pointer, and some pointers only be changed by a specific instruction to increment or decrement the value in one of the DTO registers. The function of the Emux control register will become more apparent with regard to FIG. 8.

The bit fields of the set pointer control register 308 are described in detail in Table 3. The set pointer is placed in either an addition or subtraction mode through the use of the Set Sub/Add Default bit. A data value stored in Set Offset is used in the performance of the addition or subtraction.

TABLE 3

SET POINTER CONTROL REGISTER 308

| Bit[15] | Counter Reset. When asserted the counters for the Write Chunk, Read Chunk, and Way Pointers are held in reset. '0' after reset |
|---|---|
| Bit[14] | Set Reset. When asserted the Set Pointer is held in reset (all 0's). '0' after reset. |
| Bit[13] | Enable Set Pointer. A '0' to '1' transition on this bit causes the Set Pointer to be enabled for one clock (i.e. the Set Offset is added/subtracted, depending on the Set Sub/Add Default, to the present Set Pointer). '0' after reset. |
| Bit[12] | Set Sub/Add Default. This bit defines the default subtract/add mode of the Set Pointer when the DTO Set Next bit is not active. In other words, it sets the direction of the Set Pointer when it is being driven (enabled) by a carry out of the Way or Read Chunk Pointers. When '1' the default mode is subtract. |

TABLE 3-continued

SET POINTER CONTROL REGISTER 308

'0' after reset.
Bit[11:0]  Set Offset. This is the value that is added/subtracted from the Set Pointer when the Set Enable (from the Emux) is activated. Reset value is '0000 0000 0001. Some memories may ignore certain bits depending on their size.

The address pointer register 310 includes three bit fields: a Read Chunk pointer, a Way pointer, and a Set pointer. In one embodiment, these pointers are read-only via this configuration register.

The testmode configuration register 312 includes four bits: a compare/signature bit, a data/tag bit, a PBIST enable bit, and an I/O bit. The compare/signature bit is a writeable bit. It determines whether the data sample and compare circuit 28 performs a compare function or a signature function on the test results of the self-test. If the compare/signature bit is a '1', then a compare function is performed. If the compare/signature bit is a '0', then a signature function is performed.

The data/tag bit is a writeable bit which determines whether to test the data array portion of memory arrays 24 or whether to test the tag array portion of the memory arrays 24. If the data/tag bit is '1', then the data array is tested. If the data/tag bit is '0', then the tag array is tested.

In one embodiment, the memory arrays 24 is comprised of a separate data array and tag array, and each array has its own PBIST registers including DTO registers which can be programmed to test its corresponding array. Additionally, the tag array can be broken down further into a separate LRU array and status array, each of which can be tested by a separate set of PBIST registers.

When the PBIST enable bit is set to '1', this initiates the PBIST sequencer to begin processing the DTO register instruction sequence. In another embodiment, an I/O pin, the DTO sequence pin 20, coupled to the exterior of the integrated circuit allows the initiation of the DTO register instruction sequence, as will be described with reference to FIG. 10.

When the I/O bit of the testmode configuration register 312 is set to '1', this allows all data sampled by the sample and compare register to also show up on the I/O pins of the memory. A tester connected to the I/O pins would be able to monitor the results of the PBIST test sampling directly. If the I/O bit is set to '0' then the I/O pins are not driven during PBIST data sampling.

The I/O register 314 holds the data pattern which is used to write to the memory arrays 24, and against which reads from the memory arrays 24 can be compared. In one embodiment, the I/O register is seventy-two bits wide, the same width as a chunk of data. By using the data/data# signal as has been described, either the data stored in the I/O register 314 or its complement can be written in to the memory arrays 24. Similarly, upon sampling from the memory arrays 24, the read data from the memory arrays 24 can be compared to either the data value stored in the I/O register or its complement.

In one embodiment, there are sixteen dynamic test operation (DTO) registers 316 which provide a sequence of control signals for manipulating the memory arrays 24. Each of the DTO registers is performed sequentially, and each register is evaluated, one per clock cycle. Additionally, a looping configuration can be set up using the DTO sequence pin 20 as previously described, such that the sixteenth DTO register loops back to the first DTO register such that more than sixteen clocks of continuous testing can be performed on the memory arrays 24.

Each of the DTO registers include the following bit fields: ADS, opcode, set direction, next set, next way, next read chunk, write chunk valid, next write chunk, data/data#, Compare/Signature. Table 4 explains the function of each bit field in detail. As the PBIST sequencer 38 evaluates each of the DTO registers 316, the proper control signals 40–46 are produced to cause the desired testing result to be performed on the memory arrays 24. The Emux control register can be used such that any of the Set, Way, or Read Chunk pointers are automatically incremented upon the carry of a different pointer. The function of the DTO registers will be described in more detail with reference to FIG. 8.

TABLE 4

DYNAMIC TEST OPERATION (15:0) 316

| | |
|---|---|
| Bit[8] | ADS. If asserted causes ADS to be asserted during the register's evaluation cycle. |
| Bit[7:4] | Opcode if ADS = '1'. If the ADS bit is asserted, then the bits in this field are applied to the memory array's read and write opcode input during the register's evaluation cycle |
| Bit[7:4] | Bit[7:4]. Address Pointer Control if ADS = '0'. If the ADS bit is deasserted, then these bits control the Address Pointer as shown below: Bit[7] - Set Direction. Determines whether the Set Offset is added or subtracted from the Set Pointer when the Next Set bit is asserted. '0' = add, '1' = subtract Bit[6] - Next Set. If '1' the Set Offset is added/subtracted (see Set Direction bit) from the Set Pointer when the register is evaluated. Bit[5] - Next Way. If '1' the Way pointer is incremented when the register is evaluated. Bit[4] - Next Read Chunk. If '1' the Read Chunk pointer is incremented when the register is evaluated. |
| Bit[3] | WC Val. If '1' the Write chunk Valid signal is asserted to the memory when the register is evaluated. |
| Bit[2] | Next Write Chunk. If '1' the Write Chunk pointer is incremented when the register is evaluated. |
| Bit[1] | DBar. Controls selection of Data/Data# for Data writes, Data (read) compares, and Tag (read) compares. '1' selects Data#, which is the complement of Test Data/Compare Data. |
| Bit[0] | Sample Enable. If '1' the Sample latch in each output buffer is enabled during the evaluation cycle and the compare logic is enabled. |

FIG. 8 shows one embodiment of DTO registers programmed to produce resultant wave forms. In this embodiment, there are twenty-one DTO registers.

Each DTO register produces a resultant change to the address, data, and control signals going to the memory arrays 24. In this example, the set pointer has an initial value of N, and the chunk data has an initial value of D#.

At clock 11, corresponding to the bit values of the eleventh DTO register, the Write Chunk Valid is strobed to prepare for the following write cycle. The Write Chunk Valid is strobed in response to the wcval bit set to '1'. The chunk data is changed to D in response to the DBAR bit having value '0' indicating that test data 178 is to be provided directly to the memory arrays 24.

At clock 12, ADS is strobed in response to the ADS bit set in the twelfth DTO register. Furthermore, a write memory operation is initiated in response to the Opcode bits of the twelfth DTO register. At clock 13, the Set pointer is incremented in the upward direction in response to both the next set bit and the set up bit of the thirteenth DTO register. Thus, the new Set pointer is N+1. At the clock 14, the Write Chunk Valid is strobed again. This time the data is D#.

At clock 15, ADS is strobed and another write memory operation is initiated. At clock 16, the Set pointer is decremented in a downward direction in response to both the next set bit and the set up bit of the sixteenth DTO register. Thus, the new Set pointer is N.

At clock 18, ADS is strobed and a read memory operation is initiated. The Chunk is incremented via the Next Chunk bit set to '1' in the nineteenth DTO register. As can be seen from the timing diagram, the Chunk pointer rolls over from 3 to 0. The Emux control register is set such that the carry from the Chunk pointer carries over to the Way pointer causing the Way pointer to increment from its value of 3. The Way pointer also rolls over. In this example, the Emux control register is also set up such that the Way pointer carries over to the Set pointer. Thus, when the Way pointer rolls over from 3 to 0, the Set pointer is also incremented by the Set Offset of the set pointer control register 308.

Testing Methodology

A standard way of testing a single die involves performing tests at low speed to test for gross defects prior to packaging the die. The die was then packaged, and the part was retested to determine how fast it could run before it started failing.

However, with two die, there is a potential for too high of testing fallout if only gross level testing is performed on each die independently prior to packaging the two die in the same package. For if either die is not able to run at a high speed, then the combined integrated circuit would not run to the high speed.

Thus, it is desirable to test each die at high speeds prior to packaging the processor 12 and the memory cache 14 together. High speed testers, however, are quite expensive. However, by using a relatively low speed tester connected to either the private bus 13 or the serial path 18, testing using the PBIST circuitry is possible.

FIG. 9 shows a flow diagram of one method of testing the memory 14 using the PBIST circuitry 30. At the block 400, a low speed clock mode is used to program the self-test registers with a sequence of operations. For example, a low speed integrated circuit tester can program the PBIST registers 32 at the tester clock rate. At the block 402, a high speed clock mode is used to execute the sequence of operations. For example, the tester can initiate the DTO register sequence of instruction using the clock multiplier to perform the self-test at a clock rate which is higher than that of the tester. Finally, at block 404, the results of the self-test can be checked. This can be performed using the tester at the tester clock rate.

FIG. 10 shows a flow diagram of the use of the DTO sequence pin. At a block 406 the DTO register instruction sequence is performed. In one embodiment, once the DTO register instruction sequence is initiated via either strobing the DTO sequence pin or by setting the PBIST enable bit of the testmode configuration register 312, all DTO registers are provided to the control logic 142 (FIG. 4) to provide the appropriate address, data, and control signals to the memory arrays 24.

The flow diagram continues at block 408 in which a determination is made whether the DTO sequence pin was strobed. If the DTO sequence pin was strobed then the flow diagram returns to the block 406, at which the DTO register instruction sequence is performed again. This embodiment allows for ease of repeating the DTO register instruction sequence simply by strobing an external pin.

In one embodiment, an edge triggered latch can be used to "remember" that the external pin has been strobed, such that the DTO register instruction sequence can be repeated without a delay between the evaluation of the last DTO register of one sequence and the evaluation of the first DTO register of the subsequent sequence. A continuous loop of the DTO register instruction sequence can be maintained by strobing the DTO sequence pin prior to each sampling at block 408. In this way, the addressing pointers can be incremented to test the entire cache. In one embodiment, sampling of the DTO sequence pin can be enabled or disabled by various means.

In one embodiment, for each initialization of the DTO register instruction sequence, all DTO registers are evaluated to provide address, data, and control signals to the arrays 24. In another embodiment, only a portion of the DTO registers are evaluated. In another embodiment, a counter is used to provide a count of how many times the DTO register instruction sequence is to be performed. Still another embodiment makes use of the carry bits from the addressing counters in order to perform a count down of a counter. When the counter reaches a predetermined value, execution of the DTO register instruction sequence terminates.

Burn-In Testing

Integrated circuits typically are processed through a burn-in stage in which the integrated circuits are subjected to extreme heat in order to facilitate failure modes in the part. The integrated circuits typically undergo minimal functional testing during burn-in since an expensive test fixture needs to be coupled to each integrated circuit in order to fully test it. After burn-in, full functional testing is normally performed.

The present invention allows for a tester to be connected to the serial path 18 of a packaged integrated circuit device. Programmed self-testing can be performed during the burn-in in order to save total throughput test time. Throughput test time for integrated circuit devices such as microprocessors is often critical.

FIG. 11 is a flow diagram showing that the programmable built-in self-test functions can be used during burn-in. At block 410, the integrated circuit is placed in a burn-in environment in which the device is subjected to an induced elevated temperature. The device may also be subjected to elevated voltage. At block 412, the programmable built-in self-test is performed and the results are checked.

The normal built-in self-test is optionally performed as shown at block 414. The normal BIST is performed to toggle all nodes in order to stress the device and check for latent defects. At block 416, the programmable built-in self-test is optionally performed again. At block 418, burn-in is terminated.

Other embodiments

FIG. 12 illustrates a method of using the present invention without the use of the POST state machine 160. Instead the DTO registers can be increased in size to accommodate the testing which was previously performed by the POST state machine. The DTO registers will have a reset default corresponding to the desired POST test sequence. For example, one POST test sequence is the 13N March test, described in Appendix 1.

In the foregoing specification the invention has been described with reference to specific exemplary embodiments thereof. It will, however, be evident that a various modifications and changes may be made thereto without departing from the broader spirit and scope of the invention as set forth in the appended claims. The specification and drawings are accordingly to be regarded as illustrative rather than a restrictive sense.

APPENDIX 1

The 13N March test is a well-known memory test. It is comprised of the following shorthand operations:

Up(W0); Up(R0,W1,R1), Up(R1,W0,R0); Dn(R0,W1,R1); Dn(R1, W0,R0)

'Up' signifies that the operation is to occur starting at a lowest address in the memory and proceeding to a highest address in the memory. 'Down' signifies that the operation is to occur starting at a highest address in the memory and proceeding to a lowest address in the memory. 'W' signifies a write, and 'R' signifies a read. '0' signifies that a predetermined data pattern is either written or read, and '1' signifies that the complement of the predetermined data pattern is to be either written or read.

The test starts by writing a predetermined data pattern at a lowest address in the memory. The address is incremented in the upward direction, and another write of the predetermined data pattern occurs. This proceeds until all of the memory has been written.

When all of the memory has been written, then a read is performed starting at the lowest address in the memory to verify that the predetermined data pattern is read back correctly. Next the complement of the predetermined data pattern is written to the same address. Finally, a read is performed to the same address to verify that the predetermined data complement is read back correctly. The address is then incremented in the upward direction, and another set of read data/write complement/read complement is performed. The address is incremented in the upward direction again. Another set of read data/write complement/read complement is performed. This process continues until all of the memory has been written.

Next, starting again at the lowest address in memory, there is a read verification of the data complement, then there is a write of the data, then a read of data all to the same address. The address is incremented in the upward direction, and another set of read complement/write data/mad data is performed. The address is incremented in the upward direction, and the process is repeated until all of the memory has been written.

Then starting at the highest address in memory, a read verification of the data is performed, a write of the data complement is performed, and a read verification of the data complement is performed. The address is then decremented to the next lower address. Another set of read data/write complement/read complement is performed, and the address is decremented to the next lower address. This process is repeated for the entire memory.

Finally, a set of read complement/write data/read data is performed starting at the highest address in the memory. The address is decremented and the set of read complement/write data/read data is performed again. This process is repeated for the entire memory.

What is claimed is:

1. A memory device which functions as a cache for a processor, the processor being housed in a package with the memory device and accessing the memory device via a private bus, with a serial path coupling the memory device to pins of the package, the memory device comprising:

a memory array;

a programmable built-in self-test (PBIST) circuit that performs tests on the memory array, the (PBIST) circuit including address and data generation circuitry that provide test addressing and data for the memory array;

a sequencer that generates control signals coupled to the address and data generation circuitry to control self-testing of the memory array;

a set of programmable registers controlled by the sequencer that store a test sequence for testing the memory array, the set of programmable registers being programmed either by the processor via the private bus or by the pins via the serial path;

the memory device further comprising;

multiplexor means for coupling address and data signals to the memory array from either the processor via the private bus or the address and data generation circuitry of the PBIST circuit;

a data sample and compare circuit controlled by the control signals of the sequencer, the data sample and compare circuit being coupled to the memory array to capture test data results, the test data results being provided to the processor via the private bus and/or to the pins via the serial path;

clocking means for providing a low-speed clock signal used to program the set of programmable registers with the test sequence, and a high-speed clock signal used to apply the test sequence to the memory array during testing.

2. The memory device of claim 1 wherein each of the set of programmable registers comprises an operation register which provides a sequence of control signals that causes a dynamic test operation to be performed on the memory array.

3. The memory device of claim 2 further comprising a sequencing input pin coupled to the sequencer, a strobe signal applied to the sequencing input causing the sequencer to repeat the test sequence.

4. The memory device of claim 1 wherein the memory array comprises a set associative memory having a predetermined number of sets and ways.

5. The memory device of claim 1 wherein the set of programmable registers comprises a test results register that includes a signature test result bit.

6. The memory device of claim 1 wherein the test results register further includes a comparator-sticky result bit that indicates a failure of the test sequence.

7. A memory device housed in a package with a microprocessor, the memory device being coupled to pins of the package via a serial path, the memory device comprising:

a memory array;

a programmable built-in self-test (PBIST) circuit that performs tests on the memory array, the PBIST circuit including:

address and data generation circuitry that provide addressing and data for the memory array;

a sequencer that generates control signals coupled to the address and data generation circuitry to control testing of the memory array;

a set of programmable registers controlled by the sequencer that store a test sequence for testing the memory array, the set of programmable registers being programmed via the serial path;

the memory device further comprising:

a data sample and compare circuit controlled by the control signals of the sequencer, the data sample and compare circuit being coupled to the memory array to capture test results, the test results being output via the serial path;

clocking circuitry that provides a low-speed clock signal used to program the set of programmable registers with the test sequence, and a high-speed clock signal used to apply the test sequence to the memory array during testing.

8. The memory device of claim 7 wherein each of the set of programmable registers comprises an operation register which provides a sequence of control signals that causes a dynamic test operation to be performed on the memory array.

9. The memory device of claim 8 further comprising a sequencing input pin coupled to the sequencer, a strobe signal applied to the sequencing input causing the sequencer to repeat the test sequence.

10. The memory device of claim 7 wherein the memory array comprises a set associative memory having a predetermined number of sets and ways.

11. The memory device of claim 7 wherein the set of programmable registers comprises a test results register that includes a signature test result bit.

12. The memory device of claim 7 wherein the test results register further includes a comparator-sticky result bit that indicates a failure of the test sequence.

* * * * *

UNITED STATES PATENT AND TRADEMARK OFFICE
CERTIFICATE OF CORRECTION

PATENT NO. : 5,640,509
DATED : June 17, 1997
INVENTOR(S) : Balmer et al.

It is certified that error appears in the above-identified patent and that said Letters Patent is hereby corrected as shown below:

In column 4 at line 42 delete "am" and insert --are--

In column 13 at line 34 delete "mad" and insert --read--

Signed and Sealed this

Twenty-third Day of September, 1997

Attest:

BRUCE LEHMAN

Attesting Officer

Commissioner of Patents and Trademarks